United States Patent [19]

Sandmore

[11] 4,270,424
[45] Jun. 2, 1981

[54] METHOD AND APPARATUS FOR CUTTING AND RACKING LEAD FRAME STRIPS OF BOXED CAPACITORS

[75] Inventor: Donald K. Sandmore, Oak Lawn, Ill.

[73] Assignee: Western Electric Company, Inc., New York, N.Y.

[21] Appl. No.: 72,372

[22] Filed: Sep. 4, 1979

[51] Int. Cl.³ .......................... B23D 33/02; B26D 7/18
[52] U.S. Cl. .......................................... 83/167; 83/86; 83/278; 83/423; 83/151; 53/113
[58] Field of Search ................... 83/167, 423, 278, 86, 83/151, 160; 53/513, 246

[56] References Cited

U.S. PATENT DOCUMENTS

| 2,846,832 | 8/1958 | Larson et al. | 53/60 |
| 2,872,979 | 2/1959 | Schultz et al. | 83/278 X |
| 2,955,394 | 10/1960 | Anderson et al. | 53/113 X |
| 3,520,048 | 7/1970 | Esseluhn et al. | 29/429 |
| 3,687,172 | 8/1972 | Suverkropp | 53/113 X |
| 3,838,619 | 10/1974 | Brotman et al. | 83/278 |
| 4,003,125 | 1/1977 | Wallick | 29/569 |
| 4,005,626 | 2/1977 | Bateman et al. | 83/278 |
| 4,010,596 | 3/1977 | Osterholt | 83/167 |
| 4,054,238 | 10/1977 | Lloyd et al. | 228/173 |
| 4,139,980 | 2/1979 | Larson et al. | 83/86 |
| 4,203,335 | 5/1980 | Coffey | 83/278 |

Primary Examiner—Donald R. Schran
Attorney, Agent, or Firm—R. P. Miller

[57] ABSTRACT

A continuous strip (16) of metal with boxed discrete capacitors (10) assembled thereon is cyclically advanced to move a leading section of the strip into a positioned chamber (48) of a multi-chamber magazine (46). After a predetermined number of advancements of the strip, a cutter (76,83) is operated to sever the strip and then an auxiliary feed device (107–118) is rendered effective to advance the trailing extremity of the severed strip into the magazine chamber. Immediately thereafter the magazine is indexed to position another chamber to receive a subsequently advanced section of the strip. Upon loading of a magazine with a strip and assembled capacitors in each chamber, facilities (127–142) are rendered effective to advance a new magazine into position to receive additional sections of the strip with the assembled capacitors.

8 Claims, 11 Drawing Figures

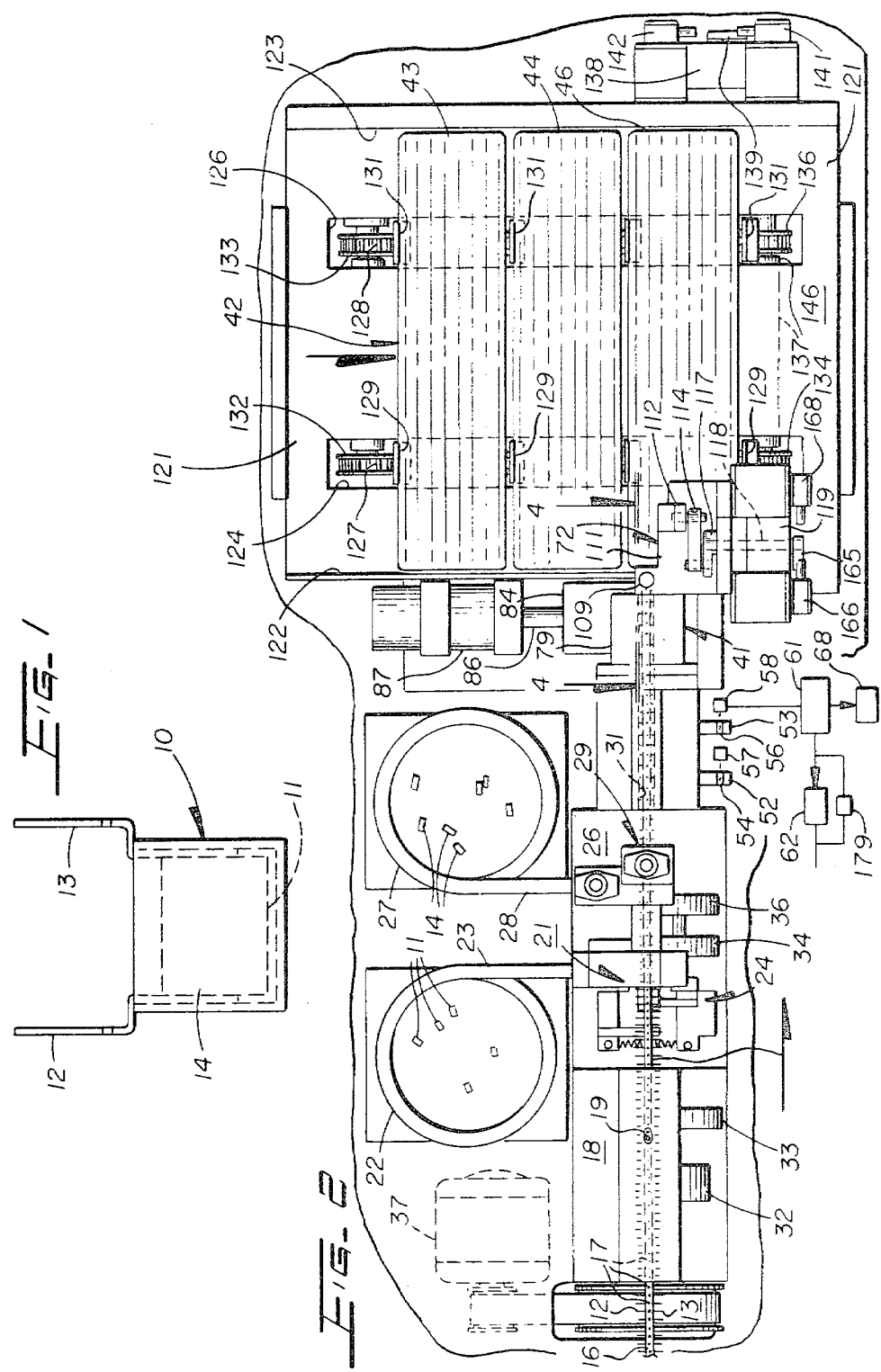

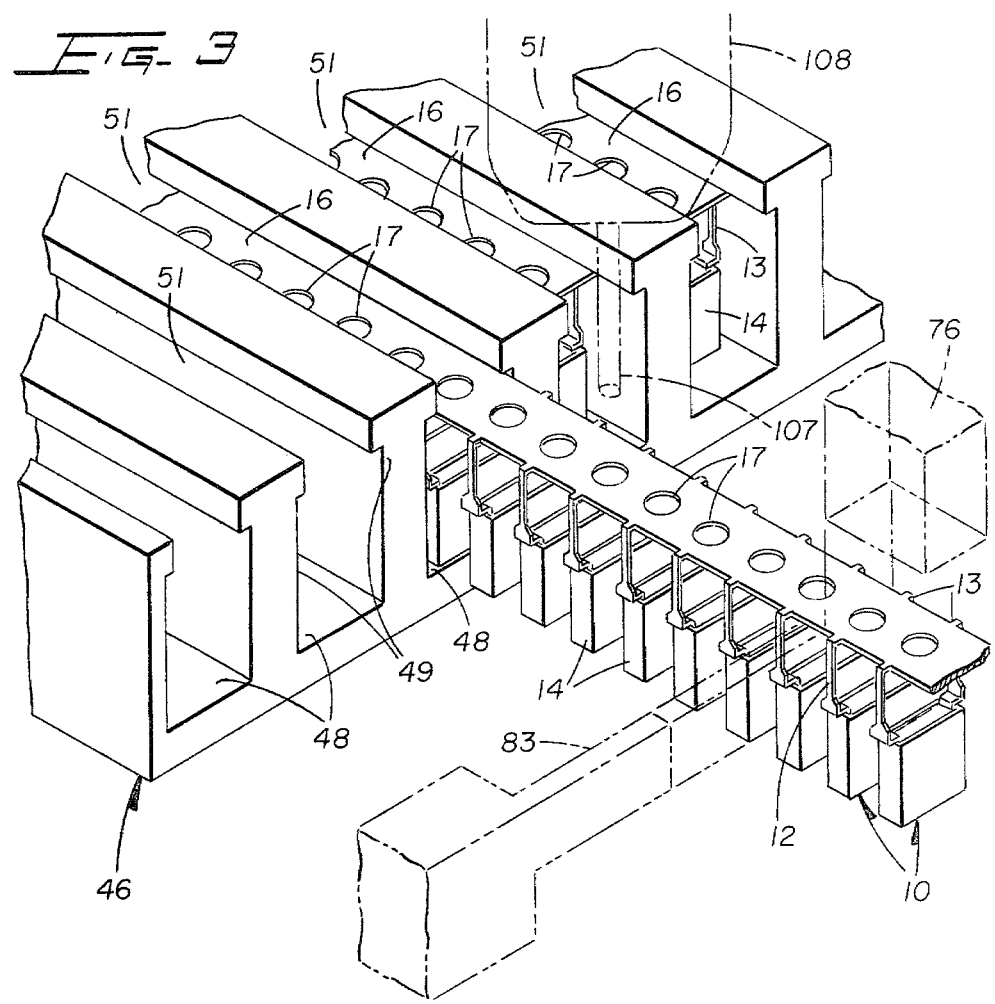

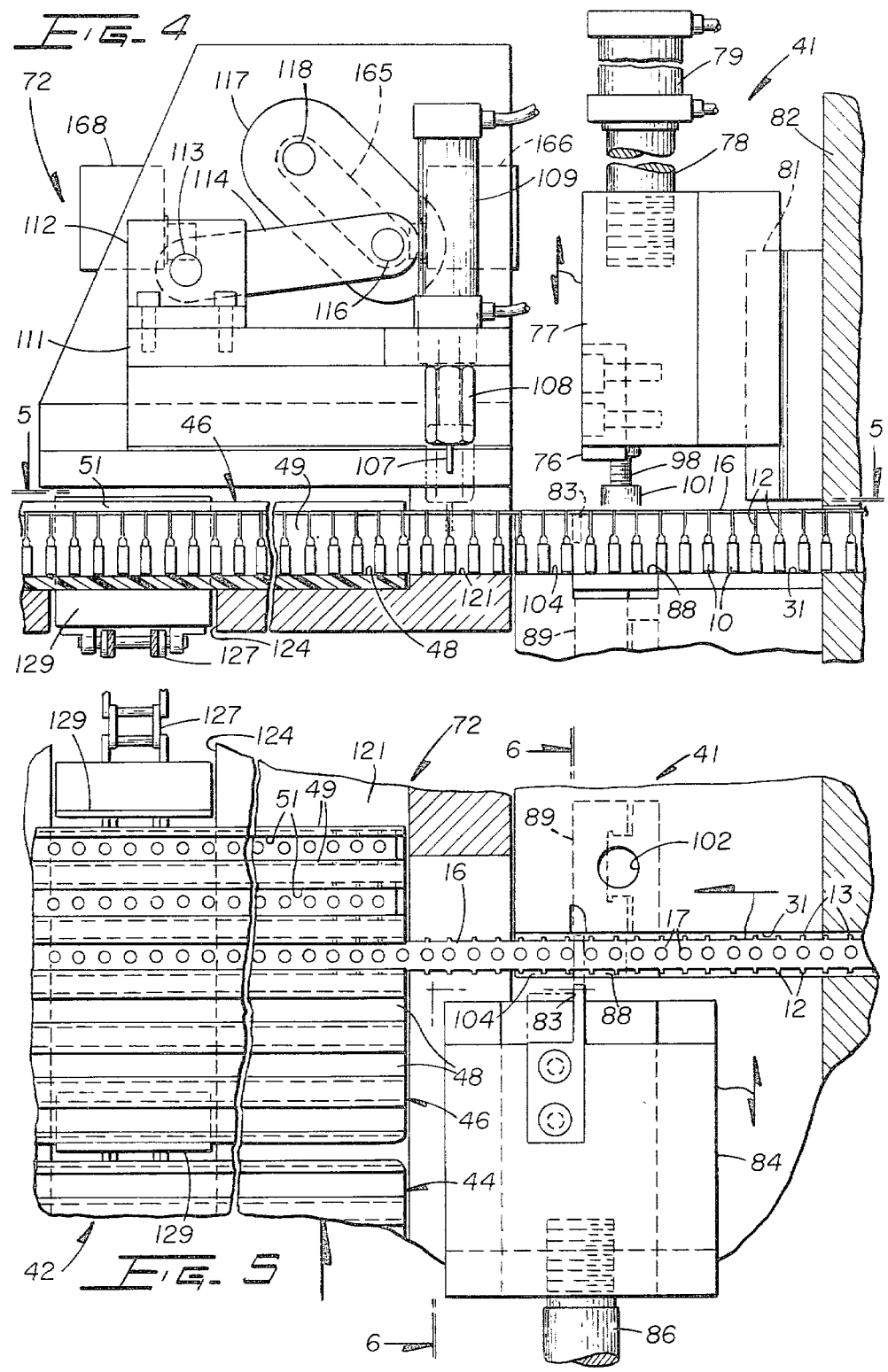

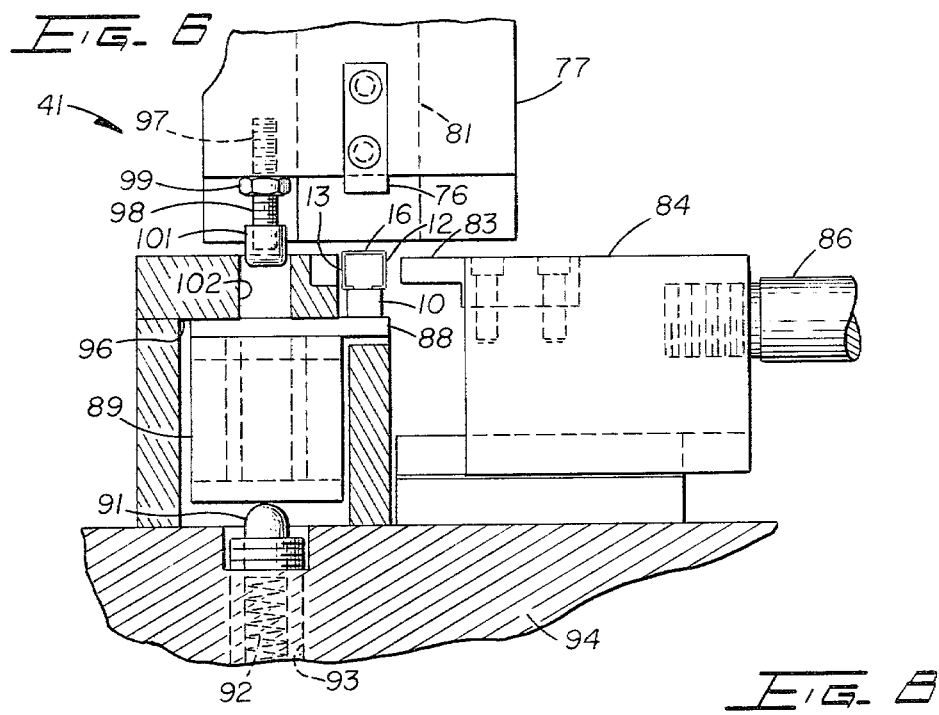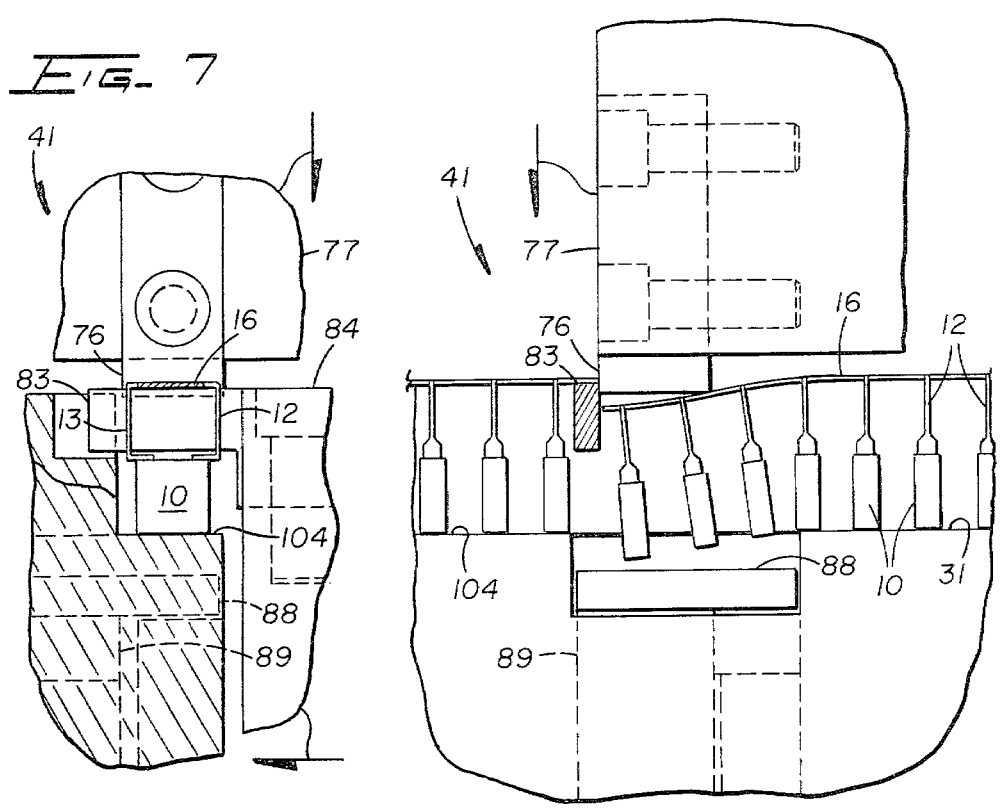

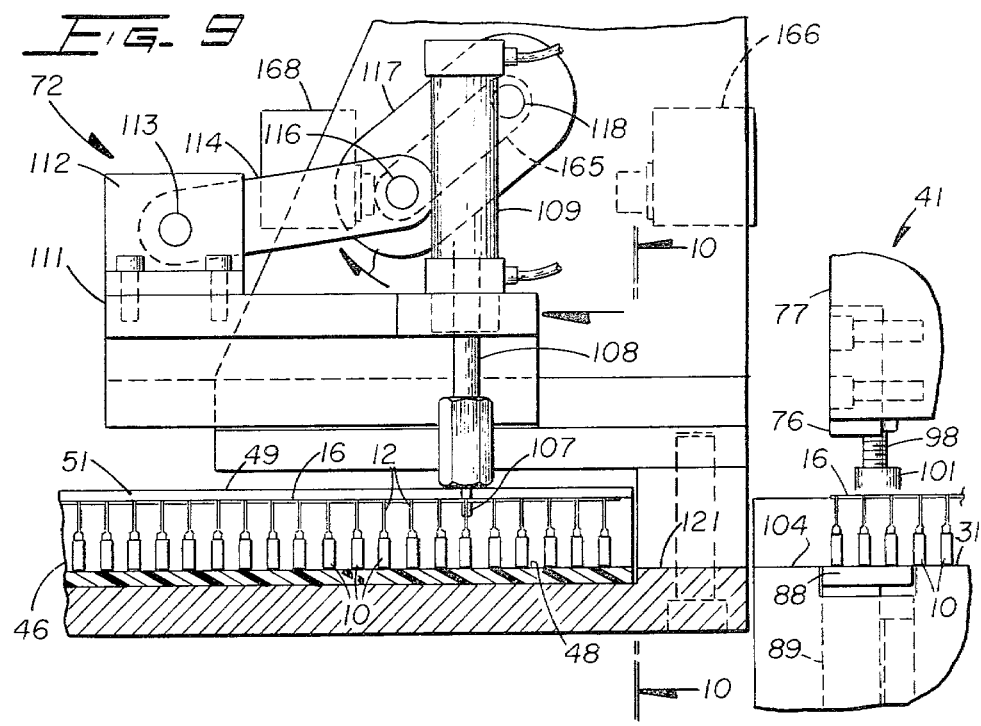
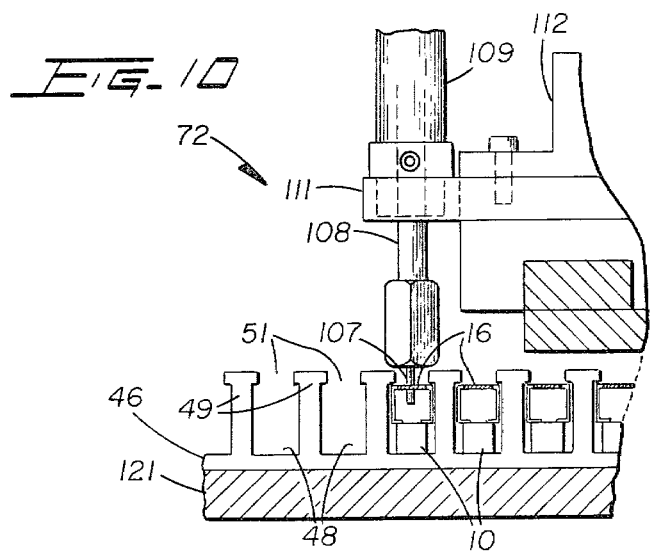

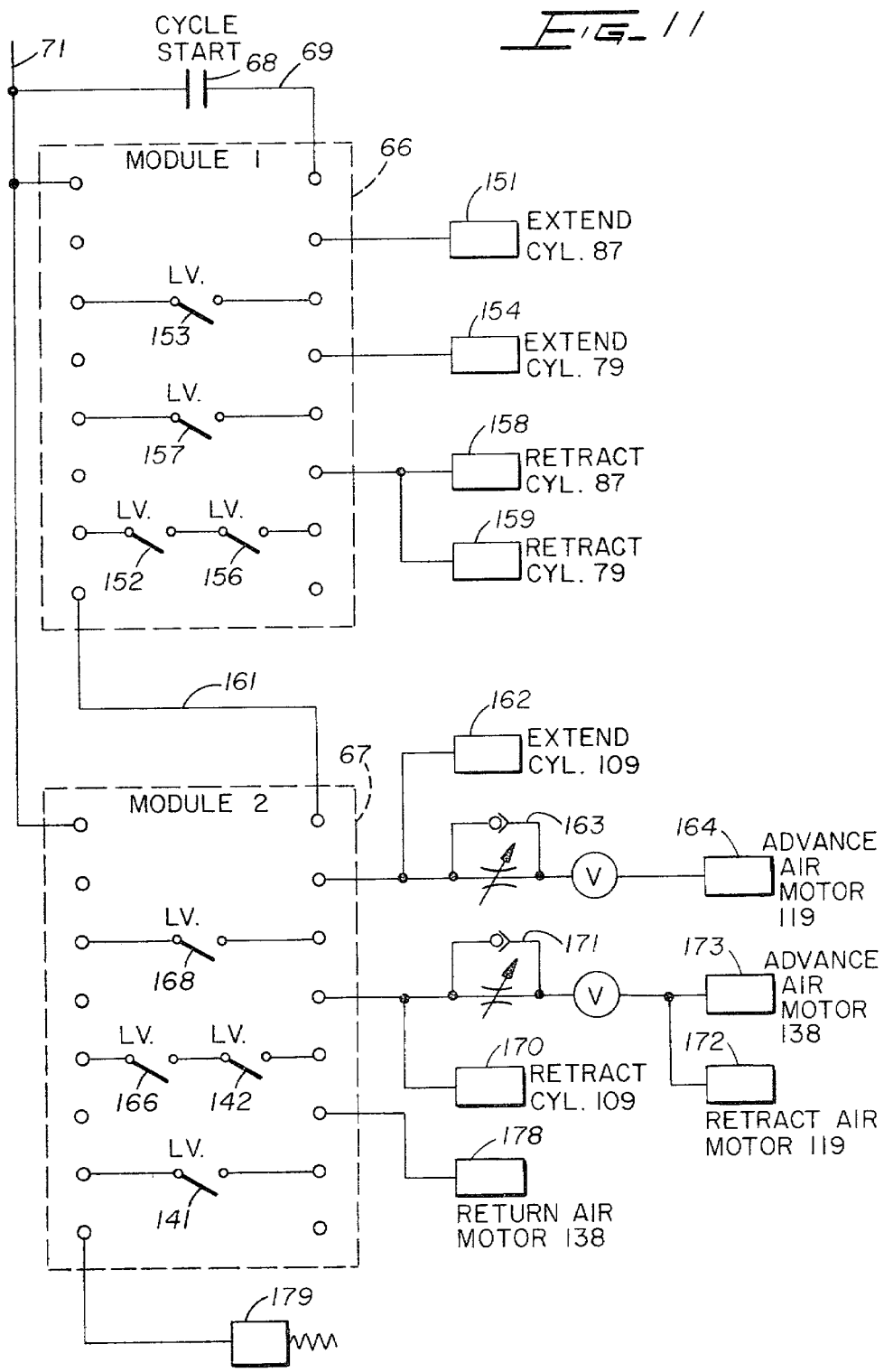

METHOD AND APPARATUS FOR CUTTING AND RACKING LEAD FRAME STRIPS OF BOXED CAPACITORS

TECHNICAL FIELD OF THE INVENTION

This invention relates to methods and apparatus for magazining sections of strip material having discrete electrical components mounted thereon, and more particularly, to advancing and severing predetermined lengths of strip material each of which is subsequently further advanced and seated in a chamber of a multi-chamber magazine.

BACKGROUND OF THE INVENTION

There are continuing commercial requirements for apparatus adapted to receive and store products emanating from various types of machines. These needs are particularly prevalent in the manufacture and handling of electrical devices which are produced on automatic fabricating machines. Numerous examples of racking and magazining devices have been developed to receive various electrical devices. In U.S. Pat. No. 3,520,048 issued July 14, 1970 to W. F. Esseluhn et al. there is shown apparatus for feeding racks of partially assembled discrete electrical components, e.g., diodes in and out of automatic assembly machines. An automatic magazining apparatus is shown in U.S. Pat. No. 2,846,832 issued Aug. 12, 1958 to E. W. Larsen et al. wherein electrical devices such as wire spring relay parts are fed from an automatic assembly machine into receiving slots formed in a series of magazines which are successively moved in a load position. The magazines are rotated into a receiving position and then indexed to present each slot to receive an electrical device.

In recent years electrical devices, such as dual in-line packages known as DIP's, have been fabricated and secured to lead frames consisting of a pair of spaced metallic strips having inwardly extending groups of spaced leads. Examples of such fabricating techniques are shown in U.S. Pat. No. 4,054,238 issued Oct. 18, 1977 to H. E. Lloyd et al. and in U.S. Pat. No. 4,003,125 issued Jan. 18, 1977 to C. W. Wallick. In co-pending application Ser. No. 072,394, filed on even date herewith in the names of J. R. Meal and D. K. Sandmore, there is shown a method and apparatus for assembling rolled metallized film capacitors onto leads depending from a continuous metallic carrier strip. This co-pending application also discloses facilities for boxing and encapsulating the capacitors.

SUMMARY OF THE INVENTION

The present invention contemplates, among other things, facilities and methods for advancing a continuous metallic strip having discrete parts assembled thereon, cutting the strip into precise lengths, and then fully inserting the severed strips of discrete parts in chambers of a magazine. The invention is particularly useful in magazining strip assembled parts of the type processed in the afore-identified co-pending Meal et al. patent application.

More particularly, a continuous strip of assembled discrete boxed capacitors or other devices are advanced into a positioned chamber of a multi-chamber magazine. After a predetermined length of strip is advanced into the positioned chamber, a cutter blade and anvil die arrangement is actuated to sever the leading section of the advanced strip. Immediately thereafter, an auxiliary feed device is operated to further advance the severed section of the strip into the aligned magazine chamber, whereafter the magazine is indexed to present another chamber to receive a subsequent length of the strip having another group of boxed capacitors assembled thereon.

BRIEF DESCRIPTION OF THE DRAWINGS

Other features and advantages of the present invention will be apparent upon consideration of the following detailed description in conjunction with the drawing wherein FIG. 1 is a side elevational view of a boxed, metallized film capacitor which may be attached to a carrier strip that is sectioned and advanced into a magazine in accordance with the principles of the present invention;

FIG. 2 is a top plan view of a capacitor assembling and boxing machine shown in the afore-identified Meal et al. co-pending application together with a magazining apparatus embodying the features of the present invention;

FIG. 3 is a perspective view of a portion of a multi-chamber magazine being loaded with a carrier strip of boxed capacitors together with a phantom outline showing of facilities for severing the strip and then further advancing the severed section of strip into the magazine;

FIG. 4 is a side elevational view partially in section taken along line 4—4 of FIG. 2 particularly showing an auxiliary strip feed facility;

FIG. 5 is a view taken along line 5—5 of FIG. 4 showing the carrier strip and the magazine in conjunction with a showing of an anvil that is utilized during the severing of the carrier strip;

FIG. 6 is a sectional view taken along line 6—6 of FIG. 5 showing the strip severing facilities and a movable support for the boxed capacitors depending from the carrier strip;

FIG. 7 is an enlarged front view of a portion of FIG. 6 illustrating the position of the anvil and a shear during a carrier strip severing operation;

FIG. 8 is a side view of the anvil and shear shown in FIG. 7;

FIG. 9 is a side view, partially in section, similar to FIG. 4 but showing the auxiliary carrier strip feed facilitaties in the process of fully advancing the strip into a chamber of the magazine;

FIG. 10 is a front view, partially in section, taken along line 10—10 of FIG. 9 showing the auxiliary carrier strip feed mechanism; and FIG. 11 is a schematic diagram of pneumatic logic system for controlling the operation of the strip shearing, feeding and magazining facilities shown in the other figures.

DETAILED DESCRIPTION

Referring to FIG. 1, there is shown a representation of a boxed metallized film capacitor 10 which comprises a rolled metallized film capacitor blank 11 which may be manufactured by the apparatus shown in copending application, Ser. No. 974,153 filed Dec. 28, 1978, in the name of W. J. Fanning. The capacitor blank is provided with heat fusible end electrodes which are secured to terminal leads 12 and 13 and is assembled within a plastic box 14 by the apparatus shown in the afore-identified Meal and Sandmore co-pending application, which application is incorporated herein by reference. As more fully described in this Meal and Sandmore copending application, the assembly is accomplished by a series of cooperating mechanisms, which are generally shown in FIG. 2, and which utilize as a basic mode of transport from one mechanism to the next a lead frame carrier strip 16 having laterally extending leads 12 and 13. The central portion of the carrier strip is provided with a series of evenly spaced feed holes 17. At a first station 18 a feed pin 19 is manipulated in a rectangular path to incrementally engage the carrier strip 16 within the feed holes 17 to index the carrier strip toward the right.

At a second staton 21, the capacitor blanks 11 are fed from a commercial vibratory bowl 22, down a chute 23 to assembly and bonding mechanisms generally designated by the reference numeral 24. These mechanisms function to bend and bond the leads 12 and 13 to the capacitor blank 11.

Subsequent cyclic advance of the carrier strip 16 moves each capacitor into a boxing and encapsulating station generally designated by the reference numeral 26. At this station plastic boxes 14 are serially advanced from a vibratory bowl 27 down a chute 28 where the boxes are partially filled with an encapsulant. The boxes are pushed onto a positioned capacitor and then the asembled capacitor and box are advanced into position to receive additional encapsulant from a nozzle dispenser 29. During the moement of the carrier strip, the boxes 14 are supported by a guideway 31.

As described in the Meal-Sandmore co-pending application, the feed of the carrier strip 16 and the assembly of the boxed capacitor is controlled by rotating a series of cams, four of which are shown in FIG. 2, and designated by the reference numerals 32, 33, 34 and 36. These cams are mounted on a shaft that is driven by a motor 37. The carrier strip with the assembled capacitors and boxes are advanced into carrier strip severing facilities 41, and then into the magazining facilities 42 constituting the subject matter of the present invention. Magazining facilities 42 include a group of three magazines 43, 44 and 46, the construction of which may be better appreciated by reference to FIG. 3. Each magazine is constructed in a generally rectangular shape with parallel component receiving chambers or channels 48 separated by T-shaped divider walls 49. The height and width of the chambers are selected to provide a clearance so that a section of the carrier strip 16 with the assembled capacitors and boxes may be freely moved within each chamber. The top of the T-shaped dividers 49 are spaced to provide slots 51 which are selected to have a width that is slightly less than the distance between the bent leads 12 and 13. The floor of each chamber acts to support the boxes, and the bent leads 12 and 13 engage the edges of the boxes to support the capacitors within the encapsulant. The magazines may be constructed of a heat resistant plastic or a machined metal. When a magazine is filled with carrier strips 16 of boxed, encapsulated capacitors 10, the magazine is transported to a curing oven where heat is applied to set the encapsulant.

Upon each rotation of the cam shaft by the motor 37, two discs 52 and 53 (see FIG. 2) with slots 54 and 56 are moved past a pair of photodetectors 57 and 58. Upon sensing the slot in disc 52, the photodetector 57 sends a signal to actuate the dispensers 58 associated with disc 53 senses each passage of the slot 56 to send an impulse to a counter 61. The slot 56 is positioned on the disc to indicate that the carrier strip 16 has been indexed one increment to advance a boxed capacitor into a chamber 48 of the magazine 46. The magazine chambers are of sufficient length to receive 75 boxed capacitors. The counter 61 is set to produce an output pulse when the photodetector senses 75 passes of the slot 56. Upon 75 advance of the carrier strip 16, the counter impresses a first signal on a solenoid operated switch 62 to interrupt the energizing circuit for the motor 37 and a second signal on a solenoid control valve which is operated to admit pressurized air to an air logic controller schematically shown in FIG. 11 and denoted by the reference numeral 66 which is operatively connected to a second air logic controller 67. The normally open solenoid valve is deisgnated 68 and is included in an air line 69 running to pressurized air supply line 71. Air logic control unit 66 and 67 are of the type sold by the Dynamco Inc. of 2648 Brenner Dr., Dallas, Tex. 75220 under Model No. DSC 413. The air logic controller is designed to sequentially operate (1) the carrier strip cutter mechanism 41 and (2) an auxiliary carrier strip feed mechanism 72 which functions to advance the severed end of the strip and the depending boxed capacitors into the aligned chamber 48 of a magazine 46.

Attention is directed to FIGS. 4, 5, 6, 7 and 8 for a consideration of the details of the cutter or severing facilities 41. The cutter facilities include a shear block or blade 76 secured to a ram 77 attached to a piston rod 78 extending into an air cylinder 79. The ram 77 is slidably mounted by gibs and ways 81 to a section 82 of the frame work for the overall machine. Cooperating with the shear block 76 is an anvil die 83 secured to and extending from a block 84 slidably mounted by gibs and ways to the frame of the machine. The block 84 is threadably attached to a piston rod 86 extending into an air cylinder 87 (see FIG. 2).

In general, operation of the air logic controller shown in FIG. 11 causes air to be applied to cylinder 87 to thrust the piston 86 and the block 84 forward to position the anvil die 83 between adjacent pairs of leads 12 and 13 extending from adjacent boxed capacitors 10. Air is subsequently applied under the control of the air logic modules shown in FIG. 11 to the air cylinder 79 to thrust the piston rod 78 and the slide block 77 downwardly to move the shear block 76 against the upper surfaces of the carrier strip 16. Further movement of the shear block acts to shear the carrier strip against the edge of the anvil die 83. It will be noted that when the anvil die 83 is initially advanced between adjacent pairs of leads, the upper portion is positioned to close proximity to the under surface of the carrier strip 16.

It will be recalled that the boxes 14 are pushed along the guideway 31 by the capacitors 11 that are secured to the leads 12 and 13. This guideway which may be in the form of several contiguous sections terminates at the shearing station 41 and a continuation thereof is provided in the form of a platform 88 that extends from the top of a slide block 89 mounted by gibs and ways to the frame of the machine. The platform 88 and the supporting block 89 (see FIG. 6) rests on a plunger 91 that is urged upwardly by a spring 92 seated with a bore 93 formed in a section 94 of the machine frame. The spring 92 normally urges the block upwardly to press the top of the platform against a section 96 of the frame so that the upper surface of the platform is level with the support surface of the guideway 31.

As best shown in FIGS. 4 and 6, the ram 77 for the shear blade 76 is provided with a threaded bore 97 to receive a threaded stud 98. A threaded lock nut 99 may be adjusted to lock the threaded stud 98 in a selected position. The threaded stud 98 is provided with a pusher head 101 that is adapted to ride through a bore 102 in the frame to engage the upper surface of the platform 88. The threaded stud 98 is adjusted so that the pusher head 101 engages and depresses platform 88 just prior to the shearing operation. The depression of the platform continues during the shearing operation. This arrangement permits the shear blade 76 to shear and depress the carrier strip 16 in the manner shown in FIG. 8. The shearing and depressing of the strip 16 occurs without any force being imparted to crush the leads 12 and 13 and the boxes 14. It will be noted from FIG. 8 that the leading or left-hand sheared section of strip and boxes are supported by another section 104 of the guideway which leads to the aligned chamber in the magazine. Upon completion of the shearing operation and the restoration of the ram 77 to the up position, the pusher head 101 is moved away from the platform allowing the spring 92 to again position the platform so that the top surface thereof acts as a continuation of the guideways leading to the chamber of the magazine.

Following severing of the strip there is a section of strip between the shear blade and the entry into the aligned magazine chamber that must be advanced into the chamber. Referring to FIGS. 4, 9 and 10 there is shown a feed pin 107 which is manipulated in a rectangular path to advance the severed trailing extremity of the severed strip into the aligned magazine chamber. More specifically, the feed pin 107 is mounted on the end of a piston rod 108 extending from an air cylinder 109 which in turn is mounted on a slide block 111. The slide block 111 is mounted by suitable gibs and ways to the machine frame. Mounted on the block 111 is a bracket 112 which is apertured to receive a pivot pin 113 that fits within an aperture formed in an end of a first ink 114. The other end of the link 114 supports a pivot pin 116 that extends into a bore formed in a second link 117. The opposite end of link 117 is fixed to the end of oscillatory drive shaft 118 driven by an air motor 119 (see FIG. 2). Actuation of the air cylinder 109 will move the pin 107 down and up, and the impartation of an oscillatory movement to the shaft 118 will reciprocate the slide block 111 so that the cumulative effect is a rectangular movement being imparted to the pin 107 to advance the trailing extremity of the strip 16 into the aligned magazine chamber. It will be noted from FIGS. 4 and 10 that the pin 107 moves along the slot 51 formed between adjacent T-shaped divider walls 49 so that the moving pin completely inserts the strip within the magazine chamber. Upon complete insertion of the severed strip within the magazine chamber, the air cylinder 109 is operated to withdraw the pin 107 from within the carrier strip feed hole. Subsequent reverse oscillation of the shaft 118 causes the linkage to move and restore the pin 107 to the original position in anticipation of the next auxiliary feed operation.

The magazines 46 are supported on the top surface of a table 121 (see FIG. 2) provided with opposed guide plates 122 and 123. The table is formed with a pair of open channels 124 and 126 for receiving a pair of continuous chains 127 and 128 having spaced cleats 129 and 131. The cleats are spaced apart sufficient distances to receive the magazines 46. As shown in FIG. 2, the chains are supported at one end by idler gears 132 and 133 while a pair of drive gears 134 and 136 support the other ends of the chains. The drive gears are mounted on a shaft 137 that is driven through a suitable gear reduction system and a one way clutch (not shown) by an air motor 138, which also drives a control arm 139 that rotates between and operates a pair of air switch valves 141 and 142 which control the extend and direction of rotation of the air motor 138.

Following each insertion of a length of strip 16 with the attached box capacitors into a magazine chamber, the air motor 138 is operated to advance the chains 127 and 128 and the cleats 129 and 131 to move the magazines to position another chamber to receive the next severed section of the carrier strip and attached boxed capacitors. When a magazine is filled, the cleats push the magazine onto a unload section 146 (see FIG. 2) of the table 121 where an attending operator removes the filled magazine. The operator will then place the loaded magazine in a curing oven to set the encapsulant, thus securing the boxes to the capacitors. The strip supported string of boxed capacitors may be removed from the magazine and the feed strips cut from the leads to provide discrete assembled capacitors 10 as shown in FIG. 1. In the alternative, the magazine filled with strips of boxed capacitors may be placed in an automatic insertion machine where the strips will be fed from the magazine and the capacitors severed from the strips for insertion in thru-holes formed in a printed circuit board.

A recapitulation of the overall operation of the apparatus and the practice of the method may be readily appreciated by reference to FIG. 11 which shows the pneumatic logic facility for controlling the operation of the various component mechanisms. When the photodetector 58 senses the assembly of the predetermined number of boxed capacitors (e.g., 75), the counter 61 sends a signal to close the solenoid operated valve 68 which is graphically illustrated by an opening in the air line 69. Air is applied to the commercial air logic module 66. The logic module 66 responds by applying air to a valve 151 of air cylinder 87 (see FIG. 2) causing the piston rod 86 to extend and move the anvil 83 between an adjacent pair of leads 12 and 13 and into close proximity to the underside of the strip 16. As the piston 86 is extended, a module valve 152 is released and opened. When the piston 86 is fully extended, module valve 153 is closed to apply air to an input valve 154 of air cylinder 79 causing the piston rod 78 to move forward and advance the block 77 and the shear blade 76. As the block 77 advances, the pusher head 101 depresses the platform 88, thus permitting the shear blade to force the strip against the anvil and thus sever the strip. Inasmuch as the platform is now depressed, the shear blade can move the strip downwardly relative to the anvil without crushing the capacitor leads. The advance to the piston rod is accompanied by release and opening of a module valve 156.

When the piston rod 78 is fully extended, module valve 157 is closed and air is applied to retract input valves 158 and 159 of air cylinders 87 and 79. The piston rods 86 and 78 will be thus retracted, releasing module valves 153 and 157.

Upon full retraction of the piston rods 86 and 78, the module logic valves 152 and 156 will close to apply air over a conduit 161 running to the second air logic module 67 which responds by applying air to an advance input valve 162 of air cylinder 109, whereupon the piston rod 108 is advanced to move the feed pin 107 within a feed hole of the severed section of the strip 16. Air is also applied at this time to a time delay arrangement 163 which, after a delayed build up of pressure, applies air to an advance input control valve 164 associated with the air motor 119 to thus initiate rotation of the shaft 118. A suitable time delay arrangement of this type is available as items Flow Control FC1 and Volume Chamber VC1, furnished by Dynamco Inc. This delayed action of the valve 164 provides the time necessary to allow the feed pin 107 to be inserted in the feed hole, prior to the initiation of rotation of the air motor shaft 118. The delayed rotation of the shaft 118 actuates the links 117 and 114 to move the slide 111, thus moving the feed pin 107 to advance the severed section of the strip fully within the magazine chamber. When air motor 119 is actuated, an arm 165 secured to the shaft 118 moves away from an air switch 166 which is thus released and opened. Operation of air motor 119 moves the arm 165 to operate air switch 168. Closure of air switch 168 causes air to be applied to input control valve 170, whereupon the piston 108 of cylinder 103 is immediately retracted to withdraw the feed pin from within the feed hole in the severed section of the strip.

Closure of air switch 168 also causes air to be applied to a time delay arrangement 171, similar to time delay arrangement 163, which is effective after a delay to apply air to a reverse input valve 172 of the air motor 119, whereupon the air motor is reversed and functions to restore the linkage 117 and 114 and the slide 111 to the initial position. The time delay of arrangement 171 is adjusted and set to allow the feed pin 107 to be fully withdrawn from the strip prior to the reverse operation of the air motor 119.

Operation of air switch 168 also is effective to apply air through the delay arrangement 171 to operate an advance input valve 173 of magazine feed air motor 138. At this time the pin 107 is in the withdrawn position, hence the air motor 138 is effective to advance the chains 127 and 128 to move another magazine chamber into position to receive a subsequent section of the carrier strip 16. When air motor 138 starts to rotate, the control arm 139 is also rotated from air switch 141 which is released and opened. When the air motor 119 restores the link 117 to the original position, the air switch 166 is closed. In a similar manner, the full advance of the magazine is accompanied by the arm 139 closing the air switch 142. Closure of the air switches 166 and 142 causes air to be impressed to a reverse input valve 178, whereupon the air motor 138 is reversed and restored to the original position in anticipation of the next magazine feed cycle.

Restoration of the air motor 138 to the original position closes the air switch 141. Closure of air switch 141 causes a control air pulse to be sent to an air operated electrical switch 179 that is connected in the control circuit for the motor 37 which, it will be recalled, drives the cam shaft to control the cyclic operation of the overall apparatus. When the photodetector sensed the 75th rotation of the slotted control disc 53, a signal is generated by the counter 68 that is utilized to open the switch 62 in the power control circuit for the motor 37. The closure of air operated switch 179 completes a bypass circuit around the now open counter operated motor control switch 62 and, thus, the motor 37 is again energized to initiate another cyclic operation of the overall machine.

Normally, the motor drives the cam shaft and the various assembly mechanisms at a speed that allows the strip shear and auxiliary feed mechanisms to operate with no apparent interruption in the normal feed cycle of the main strip pin 10; that is, the shearing and auxiliary feed operations occur during the normal dwell in the feed of the strip 16 by the main feed pin 19.

I claim:

1. An apparatus for advancing sections of a carrier strip having spaced feed holes into chambers of a multi-chamber magazine, which comprises:

T-shaped dividers defining the chambers and having top sections spaced apart to provide feed slots;

means for cyclically advancing sections of the carrier strip into a chamber of the magazine;

means rendered effective upon advance of a predetermined length of the strip into a chamber for severing the strip;

auxiliary means including a feed pin rendered effective upon completion of operation of the severing means for engaging the feed pin within a carrier strip feed hole and advancing the pin through and along a feed slot to move the severed section of strip completely within the chamber of the magazine; and means rendered effective upon completion of operation of the auxiliary advancing means for moving the magazine to present another chamber in position to receive a subsequently advanced section of the carrier strip.

2. An apparatus, as defined in claim 1, wherein the carrier strip is provided within pairs of depending leads attached to discrete electrical components, and wherein the severing means comprises:

an anvil;

means for moving the anvil between adjacent pairs of leads and into close proximity to the carrier strip;

a shearing blade; and means for moving the shearing blade against the strip to force the strip against the anvil and shear the strip.

3. An apparatus as defined in claim 2, which includes:

means for supporting the discrete electrical components during the advance of the strip between the anvil and blade; and means for moving the support means from engagement with the components during movement of the shear blade.

4. An apparatus for receiving a plurality of spaced devices supported on a carrier strip, which comprises:

a rack having a slot therein for receiving the strip and articles supported thereon;

a first means for incrementally advancing the strip toward and into said slot;

an anvil means mounted for movement into proximity of the strip;

control means rendered effective upon a predetermined number of advancements of the strip for moving said anvil into proximity of said strip between a pair of spaced devices;

a cutting means activated by the control means and mounted for movement into engagement with the strip to cooperate with the anvil means to sever the strip; and a second means rendered effective following the severing of the strip for further moving the strip of the devices into said slot in said rack.

5. An apparatus for severing and advancing a carrier strip having spaced feed holes and pairs of leads depending therefrom to which are attached electrical devices fitted within boxes filled with an encapsulant, which comprises:

receive a threaded stud 98. A threaded lock nut 99 may be adjusted to lock the threaded stud 98 in a selected position. The threaded stud 98 is provided with a pusher head 101 that is adapted to ride through a bore 102 in the frame to engage the upper surface of the platform 88. The threaded stud 98 is adjusted so that the pusher head 101 engages and depresses platform 88 just prior to the shearing operation. The depression of the platform continues during the shearing operation. This arrangement permits the shear blade 76 to shear and depress the carrier strip 16 in the manner shown in FIG. 8. The shearing and depressing of the strip 16 occurs without any force being imparted to crush the leads 12 and 13 and the boxes 14. It will be noted from FIG. 8 that the leading or left-hand sheared section of strip and boxes are supported by another section 104 of the guideway which leads to the aligned chamber in the magazine. Upon completion of the shearing operation and the restoration of the ram 77 to the up position, the pusher head 101 is moved away from the platform allowing the spring 92 to again position the platform so that the top surface thereof acts as a continuation of the guideways leading to the chamber of the magazine.

Following severing of the strip there is a section of strip between the shear blade and the entry into the aligned magazine chamber that must be advanced into the chamber. Referring to FIGS. 4, 9 and 10 there is shown a feed pin 107 which is manipulated in a rectangular path to advance the severed trailing extremity of the severed strip into the aligned magazine chamber. More specifically, the feed pin 107 is mounted on the end of a piston rod 108 extending from an air cylinder 109 which in turn is mounted on a slide block 111. The slide block 111 is mounted by suitable gibs and ways to the machine frame. Mounted on the block 111 is a bracket 112 which is apertured to receive a pivot pin 113 that fits within an aperture formed in an end of a first ink 114. The other end of the link 114 supports a pivot pin 116 that extends into a bore formed in a second link 117. The opposite end of link 117 is fixed to the end of oscillatory drive shaft 118 driven by an air motor 119 (see FIG. 2). Actuation of the air cylinder 109 will move the pin 107 down and up, and the impartation of an oscillatory movement to the shaft 118 will reciprocate the slide block 111 so that the cumulative effect is a rectangular movement being imparted to the pin 107 to advance the trailing extremity of the strip 16 into the aligned magazine chamber. It will be noted from FIGS. 4 and 10 that the pin 107 moves along the slot 51 formed between adjacent T-shaped divider walls 49 so that the moving pin completely inserts the strip within the magazine chamber. Upon complete insertion of the severed strip within the magazine chamber, the air cylinder 109 is operated to withdraw the pin 107 from within the carrier strip feed hole. Subsequent reverse oscillation of the shaft 118 causes the linkage to move and restore the pin 107 to the original position in anticipation of the next auxiliary feed operation.

The magazines 46 are supported on the top surface of a table 121 (see FIG. 2) provided with opposed guide plates 122 and 123. The table is formed with a pair of open channels 124 and 126 for receiving a pair of continuous chains 127 and 128 having spaced cleats 129 and 131. The cleats are spaced apart sufficient distances to receive the magazines 46. As shown in FIG. 2, the chains are supported at one end by idler gears 132 and 133 while a pair of drive gears 134 and 136 support the other ends of the chains. The drive gears are mounted on a shaft 137 that is driven through a suitable gear reduction system and a one way clutch (not shown) by an air motor 138, which also drives a control arm 139 that rotates between and operates a pair of air switch valves 141 and 142 which control the extend and direction of rotation of the air motor 138.

Following each insertion of a length of strip 16 with the attached box capacitors into a magazine chamber, the air motor 138 is operated to advance the chains 127 and 128 and the cleats 129 and 131 to move the magazines to position another chamber to receive the next severed section of the carrier strip and attached boxed capacitors. When a magazine is filled, the cleats push the magazine onto a unload section 146 (see FIG. 2) of the table 121 where an attending operator removes the filled magazine. The operator will then place the loaded magazine in a curing oven to set the encapsulant, thus securing the boxes to the capacitors. The strip supported string of boxed capacitors may be removed from the magazine and the feed strips cut from the leads to provide discrete assembled capacitors 10 as shown in FIG. 1. In the alternative, the magazine filled with strips of boxed capacitors may be placed in an automatic insertion machine where the strips will be fed from the magazine and the capacitors severed from the strips for insertion in thru-holes formed in a printed circuit board.

A recapitulation of the overall operation of the apparatus and the practice of the method may be readily appreciated by reference to FIG. 11 which shows the pneumatic logic facility for controlling the operation of the various component mechanisms. When the photodetector 58 senses the assembly of the predetermined number of boxed capacitors (e.g., 75), the counter 61 sends a signal to close the solenoid operated valve 68 which is graphically illustrated by an opening in the air line 69. Air is applied to the commercial air logic module 66. The logic module 66 responds by applying air to a valve 151 of air cylinder 87 (see FIG. 2) causing the piston rod 86 to extend and move the anvil 83 between an adjacent pair of leads 12 and 13 and into close proximity to the underside of the strip 16. As the piston 86 is extended, a module valve 152 is released and opened. When the piston 86 is fully extended, module valve 153 is closed to apply air to an input valve 154 of air cylinder 79 causing the piston rod 78 to move forward and advance the block 77 and the shear blade 76. As the block 77 advances, the pusher head 101 depresses the platform 88, thus permitting the shear blade to force the strip against the anvil and thus sever the strip. Inasmuch as the platform is now depressed, the shear blade can move the strip downwardly relative to the anvil without crushing the capacitor leads. The advance to the piston rod is accompanied by release and opening of a module valve 156.

When the piston rod 78 is fully extended, module valve 157 is closed and air is applied to retract input valves 158 and 159 of air cylinders 87 and 79. The piston rods 86 and 78 will be thus retracted, releasing module valves 153 and 157.

Upon full retraction of the piston rods 86 and 78, the module logic valves 152 and 156 will close to apply air over a conduit 161 running to the second air logic module 67 which responds by applying air to an advance input valve 162 of air cylinder 109, whereupon the piston rod 108 is advanced to move the feed pin 107 within a feed hole of the severed section of the strip 16. Air is also applied at this time to a time delay arrangement 163 which, after a delayed build up of pressure, applies air to an advance input control valve 164 associated with the air motor 119 to thus initiate rotation of the shaft 118. A suitable time delay arrangement of this type is available as items Flow Control FC1 and Volume Chamber VC1, furnished by Dynamco Inc. This delayed action of the valve 164 provides the time necessary to allow the feed pin 107 to be inserted in the feed hole, prior to the initiation of rotation of the air motor shaft 118. The delayed rotation of the shaft 118 actuates the links 117 and 114 to move the slide 111, thus moving the feed pin 107 to advance the severed section of the strip fully within the magazine chamber. When air motor 119 is actuated, an arm 165 secured to the shaft 118 moves away from an air switch 166 which is thus released and opened. Operation of air motor 119 moves the arm 165 to operate air switch 168. Closure of air switch 168 causes air to be applied to input control valve 170, whereupon the piston 108 of cylinder 103 is immediately retracted to withdraw the feed pin from within the feed hole in the severed section of the strip.

Closure of air switch 168 also causes air to be applied to a time delay arrangement 171, similar to time delay arrangement 163, which is effective after a delay to apply air to a reverse input valve 172 of the air motor 119, whereupon the air motor is reversed and functions to restore the linkage 117 and 114 and the slide 111 to the initial position. The time delay of arrangement 171 is adjusted and set to allow the feed pin 107 to be fully withdrawn from the strip prior to the reverse operation of the air motor 119.

Operation of air switch 168 also is effective to apply air through the delay arrangement 171 to operate an advance input valve 173 of magazine feed air motor 138. At this time the pin 107 is in the withdrawn position, hence the air motor 138 is effective to advance the chains 127 and 128 to move another magazine chamber into position to receive a subsequent section of the carrier strip 16. When air motor 138 starts to rotate, the control arm 139 is also rotated from air switch 141 which is released and opened. When the air motor 119 restores the link 117 to the original position, the air switch 166 is closed. In a similar manner, the full advance of the magazine is accompanied by the arm 139 closing the air switch 142. Closure of the air switches 166 and 142 causes air to be impressed to a reverse input valve 178, whereupon the air motor 138 is reversed and restored to the original position in anticipation of the next magazine feed cycle.

Restoration of the air motor 138 to the original position closes the air switch 141. Closure of air switch 141 causes a control air pulse to be sent to an air operated electrical switch 179 that is connected in the control circuit for the motor 37 which, it will be recalled, drives the cam shaft to control the cyclic operation of the overall apparatus. When the photodetector sensed the 75th rotation of the slotted control disc 53, a signal is generated by the counter 68 that is utilized to open the switch 62 in the power control circuit for the motor 37. The closure of air operated switch 179 completes a bypass circuit around the now open counter operated motor control switch 62 and, thus, the motor 37 is again energized to initiate another cyclic operation of the overall machine.

Normally, the motor drives the cam shaft and the various assembly mechanisms at a speed that allows the strip shear and auxiliary feed mechanisms to operate with no apparent interruption in the normal feed cycle of the main strip pin 10; that is, the shearing and auxiliary feed operations occur during the normal dwell in the feed of the strip 16 by the main feed pin 19.

I claim:

1. An apparatus for advancing sections of a carrier strip having spaced feed holes into chambers of a multi-chamber magazine, which comprises:

T-shaped dividers defining the chambers and having top sections spaced apart to provide feed slots;

means for cyclically advancing sections of the carrier strip into a chamber of the magazine;

means rendered effective upon advance of a predetermined length of the strip into a chamber for severing the strip;

auxiliary means including a feed pin rendered effective upon completion of operation of the severing means for engaging the feed pin within a carrier strip feed hole and advancing the pin through and along a feed slot to move the severed section of strip completely within the chamber of the magazine; and means rendered effective upon completion of operation of the auxiliary advancing means for moving the magazine to present another chamber in position to receive a subsequently advanced section of the carrier strip.

2. An apparatus, as defined in claim 1, wherein the carrier strip is provided within pairs of depending leads attached to discrete electrical components, and wherein the severing means comprises:

an anvil;

means for moving the anvil between adjacent pairs of leads and into close proximity to the carrier strip;

a shearing blade; and means for moving the shearing blade against the strip to force the strip against the anvil and shear the strip.

3. An apparatus as defined in claim 2, which includes:

means for supporting the discrete electrical components during the advance of the strip between the anvil and blade; and means for moving the support means from engagement with the components during movement of the shear blade.

4. An apparatus for receiving a plurality of spaced devices supported on a carrier strip, which comprises:

a rack having a slot therein for receiving the strip and articles supported thereon;

a first means for incrementally advancing the strip toward and into said slot;

an anvil means mounted for movement into proximity of the strip;

control means rendered effective upon a predetermined number of advancements of the strip for moving said anvil into proximity of said strip between a pair of spaced devices;

a cutting means activated by the control means and mounted for movement into engagement with the strip to cooperate with the anvil means to sever the strip; and a second means rendered effective following the severing of the strip for further moving the strip of the devices into said slot in said rack.

5. An apparatus for severing and advancing a carrier strip having spaced feed holes and pairs of leads depending therefrom to which are attached electrical devices fitted within boxes filled with an encapsulant, which comprises:

first feed means including a feed pin positionable within a feed hole;

means for imparting a substantially rectangular motion to feed the pin to enter successive feed holes and advance the strip;

a shear blade mounted for movement toward the upper side of the carrier strip;

an anvil mounted for movement between adjacent pairs of leads and into proximity with the underside of the strip;

a platform for supporting the boxes as the carrier strip is advanced past the shear blade and anvil;

means rendered effective upon a predetermined advance of the carrier strip for moving the anvil between adjacent pairs of leads and into proximity to the underside of the carrier strip;

means rendered effective upon movement of the anvil for advancing the shear blade to sever the carrier strip against an edge of the anvil; and means actuated by the advance of the shear blade for moving the platform to allow the electrical components encased in the boxes to move to preclude the crushing of the leads during the shearing of the carrier strip against the edge of the anvil.

6. An apparatus for magazining strips of articles, which comprises:

a magazine comprising a plate and a plurality of parallel T-shaped members secured to the plate with slots between adjacent ends of the tops of the T-shaped members, each of said pair of adjacent T-shaped members defining with said plate a plurality of strip receiving chambers;

a guideway having a first end aligned with one of said chambers for guiding a strip of articles into the aligned chamber;

a platform mounted at the second end of said guideway for movement transverse of said guideway;

means for resiliently supporting said platform with a surface thereof at the level of said guideway;

means for incrementally advancing a strip of articles along said platform and guideway into said aligned chamber;

means for applying a shearing force to the strip of sever the strip and force the strip of articles toward said platform;

means rendered effective upon operation of said shearing means for depressing said platform against said resilient means to allow said strip of articles to move below the level of the guideway during the application of the shearing force;

an auxiliary feed means having a feed pin for engaging said strip to further advance said severed strip of articles into the aligned magazine chambers; and means for controlling the movement of said feed pin to engage the strip outside said magazine and then moving said pin into the slot between the adjacent tops of the T-shaped members defining the aligned magazine chamber to seat the severed strip of articles in the aligned chamber.

7. An apparatus for magazining strips of articles as defined in claim 6, which includes:

means for counting the numbers of operations of said incremental strip advancing means; and means responsive to a predetermined number of counts by said counting means for operating the auxiliary feed means.

8. An apparatus for magazining strips of articles as defined in claim 7, which includes:

means rendered effective following operation of said auxiliary feed means for moving said magazine to position another chamber defined by a pair of T-shaped members into alignment with said guideway.

* * * * *

UNITED STATES PATENT AND TRADEMARK OFFICE
CERTIFICATE OF CORRECTION

PATENT NO. : 4,270,424

DATED : June 2, 1981

INVENTOR(S) : D. K. Sandmore

It is certified that error appears in the above–identified patent and that said Letters Patent are hereby corrected as shown below:

Column 1, line 33, "in" should be --into--.
Column 3, line 29, "moement" should be --movement--.
Column 3, line 66, after "dispensers" should read --to meter encapsulant into the boxes. The photodetector--.
Column 4, line 15, "deisgnated" should be --designated--.
Column 4, line 19, "DSC" should be --DCS--.
Column 5, line 38, "ink" should be --link--.

Signed and Sealed this

Twentieth Day of October 1981

[SEAL]

Attest:

GERALD J. MOSSINGHOFF

Attesting Officer

Commissioner of Patents and Trademarks